United States Patent [19]

Koike et al.

[11] 4,424,265
[45] Jan. 3, 1984

[54] METHOD OF MAKING PICTURE TUBE FLUORESCENT SCREEN

[75] Inventors: Norio Koike, Fukaya; Kunihiro Ikari, Yokosuka, both of Japan

[73] Assignee: Tokyo Shibaura Denki Kabushiki Kaisha, Kawasaki, Japan

[21] Appl. No.: 419,628

[22] Filed: Sep. 20, 1982

[30] Foreign Application Priority Data

Dec. 11, 1981 [JP] Japan .............................. 56-198668

[51] Int. Cl.³ ............................................. G03C 5/00
[52] U.S. Cl. ..................................... 430/28; 427/64; 427/68
[58] Field of Search ....................... 430/28; 427/64, 68

[56] References Cited

U.S. PATENT DOCUMENTS 4,339,524 7/1982 Ichimura et al. ................ 430/28 X Primary Examiner—James R. Hoffman
Attorney, Agent, or Firm—Schwartz, Jeffery, Schwaab, Mack, Blumenthal & Koch

[57] ABSTRACT

There are disclosed a composition for making a picture tube fluorescent screen characterized by essentially consisting of a light-sensitive resin at least having recurring units (1) and (2) represented by the formulas:

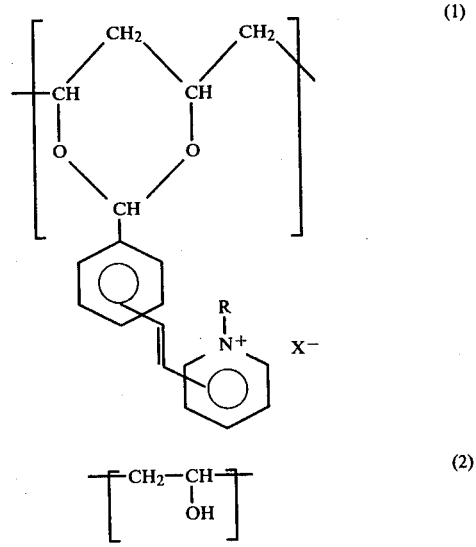

wherein R and X⁻ have the same meanings as defined in the specification, and CaS-based phosphor particles which are dispersed in an aqueous medium, and a method of making a picture tube fluorescent screen using the same.

According to this invention, it is possible to make a picture tube exhibiting an excellent light emitting efficiency and a contrast by a simple process.

3 Claims, No Drawings

METHOD OF MAKING PICTURE TUBE FLUORESCENT SCREEN

This invention relates to a composition for use in making a fluorescent screen of a color picture tube and a method of making such a fluorescent screen by using the composition, and more particularly, to a composition and a fluorescent screen making method based on a CaS phosphor.

In general, fluorescent screens of shadow mask type color picture tubes are made as described below. Namely, an aqueous light-sensitive phosphor suspension (hereinafter referred to as slurry) containing a polyvinyl alcohol (PVA), ammonium dichromate (ADC) and phosphor particles dispersed in an aqueous medium is applied to the inner surface of a face plate panel of a picture tube, and the coat thus formed is exposed to ultraviolet light through a shadow mask having a desired pattern to insolublize the exposed section of the coat. The unexposed section of the coat is then washed away with water to obtain a dot-like or stripe-like phosphor pattern. The operation described above is repeated for each of green, blue and red phosphors to obtain a fluorescent screen of the color picture tube.

Materials for use in making fluorescent screens of picture tubes should exhibit a good light emitting efficiency, and a need exists for such excellent materials. Thus, it has been proposed to use a yttrium-based phosphor exhibiting a high luminance. However, this material is expensive. On the other hand, it has been studied to use CaS in making fluorescent screens of picture tubes because CaS is cheap and exhibits a high luminance. However, when the CaS-based phosphor is added to the slurry of the conventional PVA-ADC light-sensitive material, the slurry gels about 10 minutes after the addition and cannot be applied to an inner surface of a face plate panel any more. Thus, it is practically impossible to use the CaS-based phosphor in picture tubes. More recently, in order to eliminate this problem, it has been proposed to apply a material exhibiting moderate adhering and bonding properties to the inner surface of the face plate panel and then apply the phosphor in the dry particle form to the inner surface of the face plate panel to cause the phosphor to adhere thereto (see Japanese Provisional Patent Publication No. 46642/1981). However, according to this method, it needs extremely long period of time in the exposure to form a desired pattern, and it is difficult to make a sufficient amount of the phosphor to adhere to the inner surface of the face plate panel. Therefore, in spite of using the CaS-based phosphor having high luminance, it does not form the phosphor having sufficient high luminance and it is not suitable for practical purposes.

The object of the present invention is to eliminate the problems of the prior art and provide a composition for making a fluorescent screen, which is based on a CaS phosphor exhibiting a high luminance and which exhibits a stable, sufficient sensitivity and contrast and yet shows no gelation, and a method of making a fluorescent screen by using such a composition.

The present invention relates to a composition (slurry) for making a picture tube fluorescent screen, essentially consisting of a light-sensitive resin at least having recurring units (1) and (2) represented by the following general formulas:

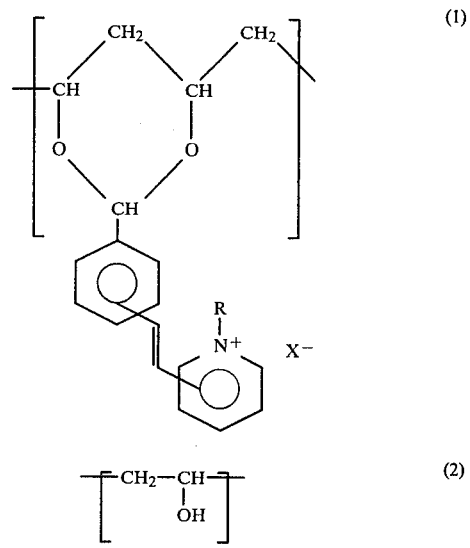

wherein R represents a hydrogen atom, an alkyl group or a lower-hydroxyalkyl group; and $X^-$ represents an anion of a strong acid, and CaS-based phosphor particles, said resin and said phosphor particles being dispersed in an aqueous medium. The present invention also relates to a method of making a picture tube fluorescent screen by using the composition.

The light-sensitive resin used in the present invention contains the recurring units represented by the general formulas (1) and (2) as the essential constituents. R in the general formula (1) may be selected from a hydrogen atom, an alkyl group or a lower-hydroxyalkyl group, and is preferably a hydrogen atom, or an alkyl or hydroxyalkyl group having one to three carbon atoms. $X^-$ in the general formula (1) is selected from a halogen ion, a sulfate ion, a phosphate ion or a p-toluenesulfonate ion.

In the present invention, the light-sensitive resin having the proportion of the recurring unit (1) in the range between 0.1 to 10 molecular percent is preferably used. If the proportion of the recurring unit (1) in the light-sensitive resin is above 10 mol %, the solubility of the resin in water deteriorates, affecting the formation of uniform slurry. Further, in the firing process conducted after the development, a residue of the light-sensitive resin remains in the light-sensitive film, adversely affecting the characteristics of the resulting fluorescent screen. Proportions of the recurring unit (1) below 0.1 mol % result in a resin which exhibits insufficient sensitivity to light and which is not suitable for practical purposes. In the present invention, a light-sensitive resin having a degree of polymerization in the range between 400 and 3000 is preferably used, and more preferably in the range between 800 and 2600.

In addition to the recurring units represented by the above-described chemical formulas, a copolymerizable vinyl monomer constituent may be contained in the light-sensitive resin in order to improve the characteristics such as solubility in water and heat decomposing property. The vinyl monomer may, for example, be vinyl acetate, vinyl propionate, olefin, styrene, acrylic acid, methacrylic acid, acrylate, methacrylate or a derivative of one of these compounds.

The light-sensitive resin used in the present invention can be prepared by reacting a polyvinyl alcohol, partially saponified polyvinyl acetate or a copolymer of these compounds with a styryl pyridinium salt having formyl group, as described in Japanese Patent Publication No. 5761/1981.

In the present invention, it is preferable that the light-sensitive resin be used in a proportion between 1.5 and 4.0% by weight based on the whole slurry. If the proportion of the light-sensitive resin is above this range, the viscosity of the slurry rises to make it difficult to apply the slurry. If the proportion of the light-sensitive resin is below this range, the sensitivity of the slurry to light deteriorates, and the exposure pattern obtained after the development becomes indistinct.

The CaS-based phosphor used in the present invention comprises CaS activated with cerium, europium, silver or the like, and they are well-known materials.

In the present invention, it is preferable that the size of the phosphor particles is in the range between 4 and 15$\mu$, and the phosphor particles be contained in a proportion between 10 and 40% by weight based on the whole slurry. If the proportion of the phosphor particles is above this range, the particles settle out in the slurry. If the proportion is below this range, the amount of the phosphor applied to the panel face plate deteriorates.

The slurry in accordance with the present invention is obtained by dispersing the above-mentioned light-sensitive resin and the CaS-based phosphor particles in a predetermined ratio in an aqueous medium. The aqueous medium used in the present invention may be water or a mixture of water and a polar organic solvent.

By adding an organic solvent, it is possible to improve the solubility of the light-sensitive resin. The organic solvent used for this purpose may be an alcohol, dimethylformamide, formamide, or dimethylsulfoxide. If the obtained slurry is unstable and tends to form sediments, a surface active agent may be added to the slurry to stabilize it. It is also possible to add known additives such as thickner and levelling agent. For easiness of the applying work, it is preferable that the viscosity of the slurry of the present invention be in the range between 15 and 30 cps (at 21° C.).

A method of forming the fluorescent screen in accordance with the present invention will now be described below.

To form the fluorescent screen, a slurry adjusted the above-mentioned composition is prepared, applied to the inner surface of the face plate panel of a picture tube, and dried. Thereafter, the inner surface of the face plate panel is exposed to ultraviolet light in a desired pattern by use of a shadow mask in order to make the light-sensitive resin in the resulting coat insoluble in water. For the exposure to ultraviolet light, it is possible to use any light source capable of emitting light containing the ultraviolet component having a wavelength in the vicinity of 340 nm, for example, a high-pressure mercury vapor lamp. In the exposure, it is sufficient that the illuminance is in the range between 0.5 and 2.0 mW/cm$^2$, and the exposure time is in the range between 2 and 60 seconds. The coat thus exposed pattern-wise is then developed to remove the unexposed light-sensitive composition. The development is effected by washing the coat with water or warm water.

Thereafter, the fluorescent screen thus formed is subjected to metal backing treatment by use of aluminum or the like when necessary. By this process, it is possible to compensate for a shortage in the amount of light emitted from the fluorescent screen. Metal backing treatment is conducted by depositing a metal such as aluminum onto the surface of the fluorescent screen. It is preferable that, before conducting metal backing treatment, an organic film be formed on the surface of the fluorescent screen by lacquering. The picture tube is then fired to adhere the phosphor onto the face plate panel. By the firing process, constituents other than the phosphor are removed by evaporation or thermal decomposition. The firing temperature is preferably between 350° and 450° C., and the firing time is preferably between 30 and 90 minutes. If the firing temperature is lower than the abovementioned range or if the firing time is shorter than the range described above, the constituents of the resin and the like are not removed completely but remain in the fluorescent screen, adversely affecting the light emitting performance.

By the process described above, a film of the CaS-based phosphor can be formed on the face plate panel of the picture tube. In order to make a color picture tube, it is necessary to form phosphor layers of the other two colors before or after the formation of the CaS-based phosphor layer. These phosphor layers may be formed in any sequence before the metal backing process. As the light-sensitive materials to be used for the formation of the phosphor, it is possible to use the light-sensitive resins in accordance with the present invention or to use the conventional PVA-ADC based materials.

In accordance with the present invention, it is possible to form the high-luminance CaS phosphor in a stable aqueous slurry uniformly on the face plate panel in a sufficient amount. Therefore, it is possible to make a picture tube exhibiting an excellent light emitting efficiency and a contrast by a simple process. In addition, since it is unnecessary to use a detrimental chemical such as ADC, the present invention is advantageous also for controlling polutions.

The present invention will hereinbelow be described in further detail by the following examples.

EXAMPLE 1

The slurry having the composition described below was applied on a face plate panel and dried. The green phosphor pattern forming positions were then exposed to an illuminance of 1.5 mW/cm$^2$ for 5 seconds in an exposure stand provided with a super-high-pressure mercury vapor lamp as a light source, followed by development with warm water to form a CaS phosphor layer. Thereafter, layers of a blue phosphor and a red phosphor were formed in the same way by use of the conventional ADC-PVA based resist. On the phosphor layers thus obtained was formed an organic film by the so-called lacquering method, and then an aluminum metal back was formed, followed by firing at 430° C. for 30 minutes to make a color picture tube. The CaS phosphor layer thus formed exhibited a luminance 10% improved over the conventional method since it was possible to make a desired amount of the phosphor adhere to the face plate panel sufficiently.

CaS:Ce green phosphor: 30 parts
Polyvinyl-$\alpha$-methyl($\gamma$-formylstyryl) pyridinium-methosulfate: 3 parts
A surface active agent: 0.1 part
Pure water: about 32 parts The conventional method described above was conducted as described below.

Namely, a sensitive sticky mixture having the composition described below was applied to a panel and dried. Then, the green phosphor pattern forming positions were exposed to an illuminance of 1.5 mW/cm² for 180 seconds in an exposure stand provided with a super-high-pressure mercury vapor lamp as the light source. CaS:Ce green phosphor particles were scattered onto the inner surface of a panel and made to adhere thereto in a required pattern. The surplus phosphor particles were then removed by an air spray. Thereafter, layers of a blue phosphor and a red phosphor were formed, respectively, in the same way by use of the conventional ADC-PVA resist.

The subsequent procedure was the same as in the method employed in the present invention. In this way, a color picture tube was made.

Dimethylaminobenzenediazonium chloride-zinc chloride: 3% by weight
Propylene glycol alginate: 0.6% by weight
Ethylene glycol: 0.2% by weight
Water: balance In the conventional method, when the exposure time is to be varied about 100 seconds, there was not formed the pattern at all.

EXAMPLE 2

First, the green phosphor and the blue phosphor were sequentially formed in a predetermined pattern by use of an ADC-PVA based resist in the same way as described in Example 1. Then, the slurry having the composition described below was applied to the face plate panel and dried. The red phosphor pattern forming positions were then exposed to an illuminance of 1.5 mW/cm² for 10 seconds in an exposure stand provided with a super-high-pressure mercury vapor lamp as the light source, followed by development with warm water to form a CaS phosphor layer. Thereafter, a color picture tube was made in the same way as described in Example 1.

The CaS phosphor layer thus formed exhibited a luminance 5% improved over the conventional method described in Example 1 since it was possible to make a desired amount of the phosphor adhere to the face plate sufficiently.

CaS:Ce, Eu red phosphor: 30 parts
Polyvinyl-α-methyl(γ-formylstryl) pyridinium-methosulfate: 3 parts
A surface active agent: 0.1 part
Pure water: about 32 parts

We claim:
1. A method of making a picture tube fluorescent screen, comprising the steps of applying, to the inner surface of a face plate panel of a picture tube, a composition essentially consisting of a light-sensitive resin at least having recurring units (1) and (2) represented by the following general formulas:

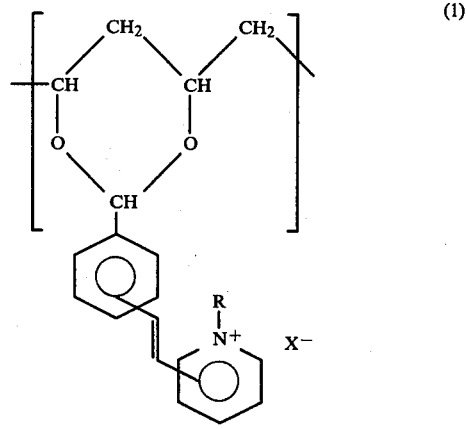

in which R designates a hydrogen atom, an alkyl group or a lower hydroxyalkyl group, and $X^-$ designates an anion of a strong acid, and CaS-based phosphor particles, said light-sensitive resin and said CaS-based phosphor particles being dispersed in an aqueous medium; exposing the coat thus formed to light in a required pattern by use of a mask; developing and then baking the coat to form a fluorescent screen in a required pattern.

2. A method of making a picture tube fluorescent screen according to claim 1, wherein $X^-$ is a halogen ion, a sulfate ion, a phosphate ion or a p-toluenesulfonate ion.

3. A method of making a picture tube fluorescent screen according to claim 1, wherein said light-sensitive resin contains 0.1 to 10 mol % of the recurring unit represented by the general formula (1).

* * * * *